United States Patent
Williamson (10) Patent No.: US 10,972,084 B1
(45) Date of Patent: Apr. 6, 2021

(54) CIRCUIT AND METHODS FOR TRANSFERRING A PHASE VALUE BETWEEN CIRCUITS CLOCKED BY NON-SYNCHRONOUS CLOCK SIGNALS

(71) Applicant: Microchip Technology Inc., Chandler, AZ (US)

(72) Inventor: Michael R. Williamson, Dallas, TX (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/867,468

(22) Filed: May 5, 2020

Related U.S. Application Data (60) Provisional application No. 62/947,195, filed on Dec. 12, 2019.

(51) Int. Cl.
*H03K 5/135* (2006.01)
*H03K 5/00* (2006.01)

(52) U.S. Cl.
CPC ... *H03K 5/135* (2013.01); *H03K 2005/00019* (2013.01); *H03K 2005/00234* (2013.01)

(58) Field of Classification Search
None
See application file for complete search history.

(56) References Cited

U.S. PATENT DOCUMENTS

| | | | |
|---|---|---|---|
| 5,343,482 A | 8/1994 | Penner et al. | |
| 5,371,765 A * | 12/1994 | Guilford | G06F 1/0328 327/107 |
| 5,600,824 A | 2/1997 | Williams et al. | |
| 5,640,398 A | 6/1997 | Carr et al. | |
| 5,838,512 A | 11/1998 | Okazaki | |
| 5,850,422 A | 12/1998 | Chen | |
| 5,905,766 A | 5/1999 | Nguyen | |
| 6,044,122 A | 3/2000 | Ellersick et al. | |
| 6,052,073 A | 4/2000 | Carr et al. | |

(Continued)

FOREIGN PATENT DOCUMENTS

| | | |
|---|---|---|
| WO | 2003039061 A2 | 5/2003 |
| WO | PCTUS2038947 | 6/2020 |

OTHER PUBLICATIONS

U.S. Appl. No. 16/563,399, filed Sep. 6, 2019, Qu Gary Jin.

(Continued)

*Primary Examiner* — Cassandra F Cox
(74) *Attorney, Agent, or Firm* — Glass and Associates; Kenneth D'alessandro; Kenneth Glass (57) ABSTRACT

A circuit for transferring a n-bit phase value between circuits includes a system clock input, a n-bit phase value generator coupled to the system clock input generating a phase value output, and an edge output indicating the phase output value is valid, a latching clock delay circuit having an input coupled to the system clock input, an input coupled to the edge output, a variable phase delay circuit coupled to the phase value output, a delay adder having a first input coupled to the phase value output, a second input coupled to a delay offset signal, and an output coupled to the control input of the variable phase delay circuit, and a phase flip-flop having a data input coupled to the output of the variable phase delay circuit, a clock input coupled to a latching clock output of the variable output clock delay circuit and a Phase Out output.

16 Claims, 3 Drawing Sheets

(56) References Cited

U.S. PATENT DOCUMENTS

| | | |
|---|---|---|
| 6,138,061 A | 10/2000 | McEnnan et al. |
| 6,150,965 A | 11/2000 | Carr et al. |
| 6,188,699 B1 | 2/2001 | Lang et al. |
| 6,333,935 B1 | 12/2001 | Carr et al. |
| 6,345,052 B1 | 2/2002 | Tse et al. |
| 6,359,479 B1 | 3/2002 | Oprescu |
| 6,584,521 B1 | 6/2003 | Dillabough et al. |
| 6,603,776 B1 | 8/2003 | Fedders et al. |
| 6,668,297 B1 | 12/2003 | Karr et al. |
| 6,671,758 B1 | 12/2003 | Cam et al. |
| 6,744,787 B1 | 6/2004 | Schatz et al. |
| 6,820,159 B2 | 11/2004 | Mok et al. |
| 6,823,001 B1 | 11/2004 | Chea |
| 6,870,831 B2 | 3/2005 | Hughes et al. |
| 7,117,112 B2 | 10/2006 | Mok |
| 7,161,999 B2 | 1/2007 | Parikh |
| 7,165,003 B2 | 1/2007 | Mok |
| 7,187,741 B2 | 3/2007 | Pontius et al. |
| 7,203,616 B2 | 4/2007 | Mok |
| 7,239,650 B2 | 7/2007 | Rakib et al. |
| 7,239,669 B2 | 7/2007 | Cummings et al. |
| 7,295,945 B2 | 11/2007 | Mok |
| 7,388,160 B2 | 6/2008 | Mok et al. |
| 7,417,985 B1 | 8/2008 | McCrosky et al. |
| 7,468,974 B1 | 12/2008 | Carr et al. |
| 7,492,760 B1 | 2/2009 | Plante et al. |
| 7,593,411 B2 | 9/2009 | McCrosky et al. |
| 7,656,791 B1 | 2/2010 | Mok et al. |
| 7,668,210 B1 | 2/2010 | Mok et al. |
| 7,751,411 B2 | 7/2010 | Cam et al. |
| 7,772,898 B2 | 8/2010 | Cheung |
| 7,807,933 B2 | 10/2010 | Mok et al. |
| 8,010,355 B2 | 8/2011 | Rahbar |
| 8,023,641 B2 | 9/2011 | Rahbar |
| 8,085,764 B1 | 12/2011 | McCrosky et al. |
| 8,243,759 B2 | 8/2012 | Rahbar |
| 8,335,319 B2 | 12/2012 | Rahbar |
| 8,413,006 B1 | 4/2013 | Mok et al. |
| 8,428,203 B1 | 4/2013 | Zortea et al. |
| 8,483,244 B2 | 7/2013 | Rahbar |
| 8,542,708 B1 | 9/2013 | Mok et al. |
| 8,599,986 B2 | 12/2013 | Rahbar |
| 8,774,227 B2 | 7/2014 | Rahbar |
| 8,854,963 B1 | 10/2014 | Muma et al. |
| 8,913,688 B1 | 12/2014 | Jenkins |
| 8,957,711 B2 | 2/2015 | Jin et al. |
| 8,971,548 B2 | 3/2015 | Rahbar et al. |
| 8,976,816 B1 | 3/2015 | Mok et al. |
| 8,989,222 B1 | 3/2015 | Mok et al. |
| 9,019,997 B1 | 4/2015 | Mok et al. |
| 9,025,594 B1 | 5/2015 | Mok et al. |
| 9,209,965 B2 | 12/2015 | Rahbar et al. |
| 9,276,874 B1 | 3/2016 | Mok et al. |
| 9,313,563 B1 | 4/2016 | Mok et al. |
| 9,374,265 B1 | 6/2016 | Mok et al. |
| 9,444,474 B2 | 9/2016 | Rahbar et al. |
| 9,473,261 B1 | 10/2016 | Tse et al. |
| 9,503,254 B2 | 11/2016 | Rahbar et al. |
| 9,525,482 B1 | 12/2016 | Tse |
| 10,069,503 B2 | 9/2018 | Zhang et al. |
| 10,104,047 B2 | 10/2018 | Muma et al. |
| 10,128,826 B2 | 11/2018 | Jin et al. |
| 10,250,379 B2 | 4/2019 | Haddad et al. |
| 10,432,553 B2 | 10/2019 | Tse |
| 10,608,647 B1 | 3/2020 | Ranganathan et al. |
| 10,715,307 B1 | 7/2020 | Jin |
| 2001/0056512 A1 | 12/2001 | Mok et al. |
| 2005/0110524 A1 | 5/2005 | Glasser |
| 2006/0056560 A1 | 3/2006 | Aweya et al. |
| 2006/0076988 A1 | 4/2006 | Kessels et al. |
| 2007/0036173 A1 | 2/2007 | McCrosky et al. |
| 2007/0064834 A1 | 3/2007 | Yoshizawa |
| 2007/0132259 A1 | 6/2007 | Ivannikov et al. |
| 2008/0000176 A1 | 1/2008 | Mandelzys et al. |
| 2008/0202805 A1 | 8/2008 | Mok et al. |
| 2010/0052797 A1* | 3/2010 | Carley ............... H03L 7/0814 331/18 |
| 2011/0095830 A1 | 4/2011 | Tsangaropoulos et al. |
| 2014/0055179 A1 | 2/2014 | Gong et al. |
| 2014/0139275 A1 | 5/2014 | Dally et al. |
| 2016/0277030 A1 | 9/2016 | Burbano et al. |
| 2016/0301669 A1 | 10/2016 | Muma et al. |
| 2017/0244648 A1 | 8/2017 | Tse |
| 2018/0131378 A1 | 5/2018 | Haroun et al. |
| 2018/0159541 A1 | 6/2018 | Spijker |

OTHER PUBLICATIONS

U.S. Appl. No. 16/795,520, filed Feb. 19, 2020, Peter Meyer.
U.S. Appl. No. 62/953,301, filed Dec. 24, 2019, Peter Meyer.
Abdo Ahmad et al: "Low-Power Circuit for Measuring and Compensating Phase Interpolator Non-Linearity", 2019 IEEE 10th Annual Information Technology, Electronics and Mobile Communication Conference (IEMCON), IEEE, Oct. 17, 2019 (Oct. 17, 2019), pp. 310-313.
PCT/US2020/037630, International Search Report, European Patent Office, dated Sep. 11, 2020.

\* cited by examiner

CIRCUIT AND METHODS FOR TRANSFERRING A PHASE VALUE BETWEEN CIRCUITS CLOCKED BY NON-SYNCHRONOUS CLOCK SIGNALS

REFERENCE TO RELATED APPLICATIONS

The present application claims priority to U.S. Provisional Patent Application Ser. No. 62/947,195, filed on Dec. 12, 2019, the contents of which are incorporated by reference herein in their entirety.

BACKGROUND

The present invention relates to data transfer between circuits. More particularly, the present invention relates to a circuit used to transfer a data value reliably between circuits that are clocked by non-synchronous clock signals.

The output of the binary phase accumulator circuit can be configured to provide an integer portion representing the number of complete clock cycles of the input clock between binary phase accumulator circuit overflows as well as the fractional portion that is stored in the register at overflow. A clock edge of the fractionally divided clock signal can be generated by delaying the input clock signal that caused the overflow by the fractional portion that is stored in the register at overflow.

There sometimes exists a need for one or more circuits that are not synchronous to the system clock signal, i.e. not synchronous to the input clock signal of the fractional frequency divider circuit, to capture and use the n-bit phase value produced by the binary phase accumulator circuit or other circuit of the fractional frequency divider circuit for various purposes. One example is counters for each phase, or group of phases, which increment or decrement at each edge of a target output clock signal generated by a frequency synthesizer employing a binary phase accumulator circuit where the target output clock signal is non-synchronous to the system clock signal. The n-bit phase value to be captured and used must adhere to proper setup and hold requirements at each clock edge presented to logic elements such as flip-flops in the other circuits clocked by a clock signal other than the system clock signal.

BRIEF DESCRIPTION

In accordance with an aspect of the present invention, a circuit for transferring a N-bit phase value between circuits clocked by non-synchronous clock signals includes an input for a system clock signal, and a phase and marker signal generator coupled to the input for the system clock signal, the phase and marker signal generator including a binary phase accumulator circuit configured to generate an n-bit phase value output, and an edge signal configured to indicate that the n-bit phase value output is a valid n-bit phase value output. The circuit further includes, a latching clock delay circuit having a first input coupled to the input system clock signal, a second input coupled to receive the edge signal of the phase and marker signal generator, and an output, an n-bit variable phase delay circuit having an input, a control input, and an output, the input coupled to the n-bit phase value output of the phase and marker signal generator, a multibit delay adder having a first input coupled to the n-bit phase value output of the phase and marker signal generator, a second input coupled to an n-bit phase delay offset signal, and an output coupled to the control input of the n-bit variable phase delay circuit, and an n-bit phase flip-flop having data inputs coupled to the output of the n-bit variable phase delay circuit, a clock input coupled to the output of the latching clock delay circuit and a Phase Out output.

In accordance with an aspect of the present invention, the latching clock delay circuit includes a gate having a first input coupled to the input system clock signal, a second input coupled to receive the edge signal of the phase and marker signal generator, and an output, a variable latching clock delay circuit having an input coupled to the output of the gate and an output, and a fixed latching clock delay circuit having an input coupled to the output of the variable latching clock delay circuit and an output coupled to the output of the latching clock delay circuit.

In accordance with an aspect of the present invention, the gate is an AND gate, and the variable latching clock delay circuit includes a control input coupled to the to the n-bit phase value output of the phase and marker signal generator.

In accordance with an aspect of the present invention, the binary phase accumulator circuit in the phase and marker signal generator is configured to accumulate a frequency control word value (FCW) at every system clock signal edge, output the accumulated FCW value as the n-bit phase value output after each system clock signal edge. When the accumulated FCW value reaches an integer overflow value, the binary phase accumulator circuit is configured to modify the generated n-bit phase value output at the subsequent system clock signal edge to be equal the integer overflow value minus an immediately previous value of the n-bit phase value output, and output the edge signal at the subsequent system clock signal edge.

In accordance with an aspect of the present invention, the circuit further includes a marker output of the phase and marker signal generator, a variable marker delay circuit having an input, a control input, and an output, the input coupled to the marker output of the phase and marker signal generator, the control input of the variable marker delay circuit coupled to the output of the multibit delay adder, and a marker flip-flop having a data input coupled to the output of the variable marker delay circuit, a clock input coupled to the latching clock delay circuit and a latched Marker Out output.

In accordance with an aspect of the present invention, the phase and marker signal generator is configured to generate a marker signal at the marker output every N system clock signal cycles in the same system clock signal cycle as the edge signal of the phase and marker signal generator.

In accordance with an aspect of the present invention, a method for transferring a transfer n-bit phase value between circuits clocked by an edge of a system clock signal and circuits clocked by an edge of a latching clock output signal, where the latching clock output signal is non-synchronous with the system clock signal includes generating a new n-bit phase value by accumulating a frequency control word in response to an edge of the system clock signal, setting a delay for the new n-bit phase value to be a function of the new n-bit phase value and a fixed period, The method further includes, when the n-bit phase value equals or exceeds an integer overflow value, generating an edge signal, setting a transfer n-bit phase value equal to a value by which the new n-bit phase value exceeded the integer overflow value, and generating a latching clock output signal responsive to the generated edge signal and delayed from the edge of the system clock signal by a latching clock delay that is a function of the transfer n-bit phase value and a fixed latching clock delay.

In accordance with an aspect of the present invention, the latching clock delay is the sum of the transfer n-bit phase value and the fixed latching clock delay.

In accordance with an aspect of the present invention, the fixed latching clock delay is derived from circuit characteristics.

In accordance with an aspect of the present invention, the fixed period is derived from characteristics of the circuits clocked by the edge of the system clock signal.

In accordance with an aspect of the present invention, the fixed latching clock delay comprises a delay derived from characteristics of the circuits clocked by the edge of the system clock signal.

In accordance with an aspect of the present invention, the latching clock delay is set to be greater than the delay for the new n-bit phase value.

In accordance with an aspect of the present invention, the method further includes generating a marker signal every N system clock edges.

In accordance with an aspect of the present invention, generating a marker signal every N system clock edges includes generating the marker signal synchronously with the edge signal.

In accordance with an aspect of the present invention, the method further includes latching the marker signal.

In accordance with an aspect of the present invention, latching the marker signal includes latching the marker signal using the generated latching clock output signal.

BRIEF DESCRIPTION OF THE DRAWING FIGURES

The invention will be explained in more detail in the following with reference to embodiments and to the drawing in which is shown.

DETAILED DESCRIPTION

Persons of ordinary skill in the art will realize that the following description is illustrative only and not in any way limiting. Other embodiments will readily suggest themselves to such skilled persons.

Figure 1:
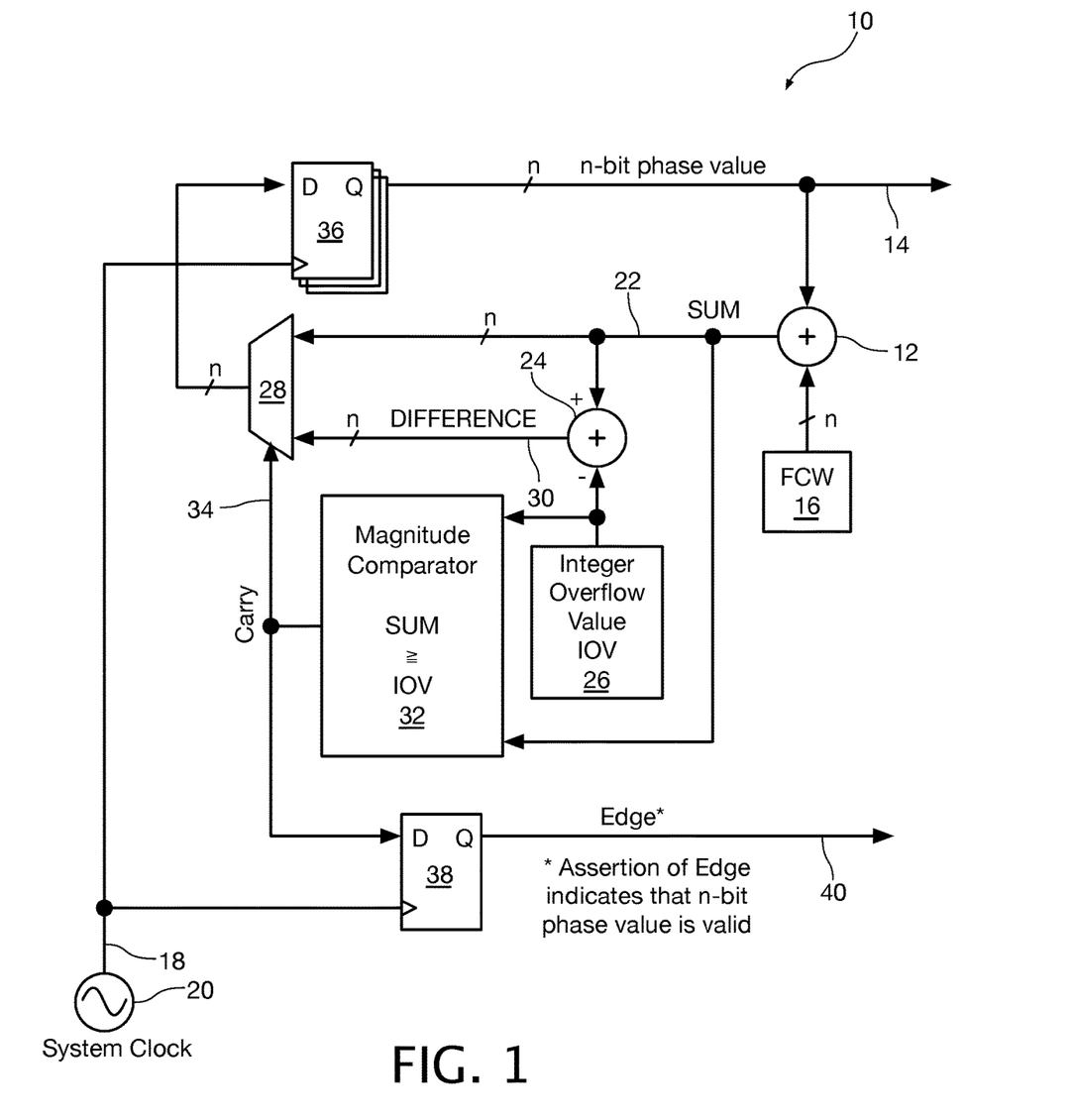
FIG. 1 is a block diagram that shows an illustrative binary phase accumulator circuit that can be employed in the present invention.

In one example shown in block diagram form in FIG. 1, a binary phase accumulator circuit 10 including an accumulator adder and a register is employed in the present invention as a fractional frequency divider circuit of a clock synthesizer. The principle behind using a binary phase accumulator circuit as a frequency divider circuit to provide integer and/or fractional frequency division of an input clock signal is the quantization of the period of the input clock signal into phase. Phase is the delay from the edge of the system clock to the edge of a target, or output, clock being produced. The phase of any clock signal can be expressed as a multi-bit (n-bit) number that represents a position (which may be expressed as, for example, time) measured from a clock edge of the input clock signal, such as an edge of a system clock signal in the example shown herein, and is used to quantize the period of the input clock signal. The most commonly-encountered example of the principle of phase is its expression in degrees or radians to represent a position on a sine wave starting at a zero crossing representative of a "clock edge" at 0° (0 radians) and extending to 360° (2 pi radians) at the end of the period (single cycle). In the present invention, phase is a unitless number representing position along the input clock signal over a single cycle of the input clock signal. Quantizing a cycle of an input clock signal into phase increments is what allows fractional division of that input clock signal. For purposes of explaining the present invention, an illustrative non-limiting example of 1,024 will be used to represent the phase of a complete cycle of an input clock signal. To illustrate this concept, if an entire cycle of the system clock signal is quantized into 1,024 parts (phase increments), a phase value of 256 quantized phase increments represents one quarter of the input clock cycle, a phase value of 512 quantized phase increments represents one half of the input clock cycle, and a phase value of 768 quantized phase increments represents three quarters of the input clock cycle.

In a binary phase accumulator cycle, each clock cycle of an input clock signal (e.g., a clock cycle of a system clock signal) produces a new n-bit phase value at the output of the accumulator adder consisting of the previous output obtained from the register summed in the adder with a frequency control word (FCW) which FCW is constant for generating a target output clock signal at the target output clock frequency. In some configurations, the n-bit phase value output is taken from the output of the register which introduces a latency of one clock cycle of the input clock signal but allows the adder to operate at a higher clock rate.

The accumulator adder in a binary phase accumulator circuit employed as a fractional frequency divider circuit is configured to overflow when the sum of the absolute value of its operands exceeds its capacity (a quantity that sets the integer portion of the frequency divisor and that is referred to in the description accompanying FIG. 1 as an integer overflow value) and, is chosen together with the FCW (that sets the fractional portion of the frequency divisor) to divide the frequency of an input clock, i.e. a system clock in the context of the present invention, by a fractional number including an integer portion and a fractional portion. The amount by which the sum of the absolute value of its operands exceeds the adder integer overflow value is the fractional number portion of the fractional divisor used by the binary phase accumulator circuit to perform frequency division. The fractional number portion is stored in the register after accumulator adder overflow so that the next accumulator cycle starts from the fractional number portion. Because the binary phase accumulator circuit is a finite state machine, the fractional number portion eventually returns to its initial value of zero.

As a non-limiting examples, in order to divide the frequency of the input clock signal by 2 where the input clock cycle has been divided into 1,024 phase increments, the FCW is chosen to be 1,024 and the capacity of the phase accumulator is set to be equal to 2,048. The circuit senses when the accumulator output exceeds the integer overflow value of 2,048 (which provides the integer portion of the divisor=2048/1024=2) and at that time the amount by which the accumulated FCW exceeds the integer overflow value (which would be 2×1,024 minus 2,048=0) is the fractional portion of the divisor. A remainder value of 0 is a fractional value of 0. In order to divide an input clock signal by 2½, the FCW is selected to be equal to 1,280 and the capacity of the phase accumulator is set to be equal to 2,048. The circuit senses when the accumulator output exceeds the capacity of 2,048 (which provides the integer portion of the divisor=2048/1024=2) and at that time the amount by which the accumulated FCW exceeds the integer overflow value (which would be 2×1,280 minus 2,048=512) is the fractional portion of the divisor. Since the phase value for an entire period of the clock cycle is 1,024 a remainder value of 512 is a fractional value of ½. In general, for any fractional divisor having an integer portion I and a fraction portion F=x/y where the input clock cycle is quantized into Q segments, FCW is chosen to be (Q+(x/y)/1).

Persons of ordinary skill in the art will appreciate that the binary phase accumulator circuit 10 is shown as a circuit employing logic elements and that the binary phase accumulator circuit 10 could be configured from software running on a processor. The binary phase accumulator 10 is configured to divide the frequency of an input clock signal by a fractional divisor including an integer portion I and a fractional portion F.

In the binary phase accumulator circuit 10 an accumulator adder 12 has a first input coupled to a current n-bit phase value output 14 and a second input coupled to a stored FCW indicated at reference numeral 16. As previously noted the value assigned to the stored FCW at reference numeral 16 is chosen based on the fractional portion of the divisor that will be used to divide the frequency of a system clock signal that is provided on line 18 from a system clock source 20, which may be provided as part of binary phase accumulator circuit 10, or may be external to binary phase accumulator circuit 10, with the system clock signal received from such an external source on line 18.

The n-bit output of the accumulator adder 12 on lines 22, denoted SUM, is coupled to a first input (minuend) of an overflow subtractor 24. The second input (subtrahend) of the overflow subtractor 24 is coupled to a stored integer overflow value (IOV) indicated at reference numeral 26. The value assigned to the stored IOV at reference numeral 26 is chosen based on the integer portion of the divisor that will be used to divide the frequency of the system clock signal that is provided on line 18 from the system clock source 20.

The n-bit SUM output of the accumulator adder 12 on lines 22, is further coupled to a first input of multiplexer 28. The n-bit DIFFERENCE output of overflow subtractor 24 on lines 30 is coupled to a second input of multiplexer 28. The n-bit SUM output of accumulator adder 12 is further coupled to a first input of magnitude comparator 32 and the stored IOV 26 is further coupled to a second input of magnitude comparator 32. The output of magnitude comparator 32, denoted CARRY, is coupled to the select input of multiplexer 28 on line 34. The n-bit output of multiplexer 28 is coupled to a data input of flip-flops 36 that is used as an n-bit phase value register. A clock input of the flip-flops 36 is coupled to the system clock signal that is provided on line 18 from the system clock source 20. The output of flip-flops 36 provide the n-bit phase value output 14 of the binary phase accumulator circuit 10.

The accumulator adder 12 in the binary phase accumulator 10 adds the FCW stored at reference numeral 16 to the current n-bit phase value output on line 14 and generates the sum output of the accumulator adder 12 (SUM) on line 22 (a new n-bit phase value). Overflow subtractor 24 subtracts the IOV stored at reference numeral 26 from the SUM on line 22 and generates the DIFFERENCE output on line 30. Magnitude comparator 32 compares the SUM on line 22 (i.e. the n-bit phase value output+FCW) to IOV and generates a CARRY signal output on line 34 only when the SUM on line 22 is greater than, or equal to, the IOV stored at reference numeral 26.

The DIFFERENCE output of the overflow subtractor 24 on lines 30 is initially negative as the IOV is greater than the SUM on lines 22. The CARRY signal on line 34 will therefore initially be low, causing the multiplexer 28 to pass the SUM on lines 22 to the data input of the flip-flops 36. The SUM on lines 22 will be latched to the output of flip-flops 36 as the n-bit phase value output on the next clock pulse of the system clock signal on line 18 from the system clock source 20.

When the SUM on lines 22 becomes equal to or greater than the IOV stored at reference numeral 26, the DIFFERENCE output of the overflow subtractor 24 on lines 30 will be equal to the fractional portion of the divisor used to divide the frequency of the system clock signal on line 18. At this time, the CARRY signal output on line 34 will become high and the multiplexer 28 will pass the fractional portion of the divisor used to divide the frequency of the system clock signal to the data input of the flip-flops 36. The fractional portion of the divisor will be latched into the output of the flip-flops 36 as the n-bit phase value output on the next clock pulse of the system clock signal on line 18 from the system clock source 20 and will be used as a transfer n-bit phase value that will be provided in accordance with the present invention.

A flip-flop 38 may optionally be included as a CARRY signal register. Data input of flip-flop 38 is coupled to the output of magnitude comparator 32 such that the CARRY signal on line 34 is coupled to flip-flop 38. The clock input of flip-flop 38 is coupled to the output of the system clock source 20 on line 18. The flip-flop 38 will latch the CARRY signal on line 34 on the next clock pulse of the system clock signal on line 18. The data output of the flip-flop 38 generates an Edge signal output on line 40. Persons of ordinary skill in the art will appreciate that the Edge signal output on line 40, delayed by the n-bit phase value on line 14, can be used as an edge of a synthesized output clock signal. The edge signal indicates that the output of the flip-flops 36 is a valid n-bit phase value, i.e. the output of the flip-flops 36 represent the fractional portion of the divisor used to divide the frequency of the system clock signal. The valid n-bit phase value is the delay from the edge of the system clock to the edge of a target, or output clock, being produced.

Figure 2:
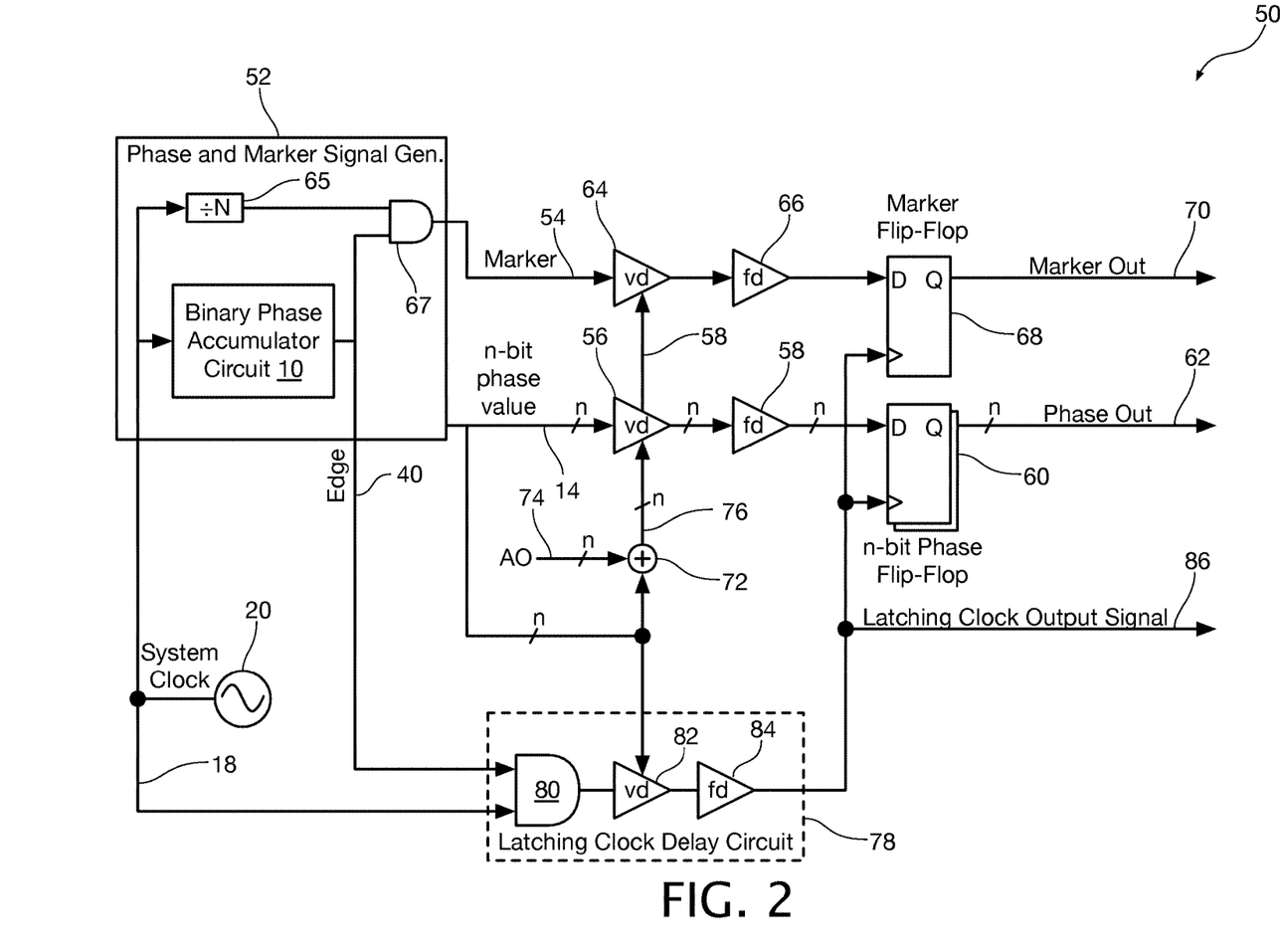
FIG. 2 is a schematic diagram of an illustrative circuit in accordance with an aspect of the invention.

Referring now to FIG. 2, a schematic diagram shows an illustrative circuit 50 in accordance with an aspect of the invention. The circuit 50 uses the variable delay represented by the n-bit phase value output from a binary phase accumulator circuit such as the binary phase accumulator circuit 10 of FIG. 1, which binary phase accumulator circuit is clocked by system clock signal on line 18 in a first clock domain to transfer the n-bit phase value output to a second clock domain that is non-synchronous to the system clock signal on line 18 in the first clock domain based on the known (but variable each clock cycle) phase offset of a clock edge of the clock signal in the second clock domain relative to the clock edge of the system clock signal on line 18 in the first clock domain.

The circuit 50 includes a phase and marker signal generator 52 that is coupled to the system clock signal on line 18 from the system clock source 20 (in the first clock domain). The phase and marker signal generator 52 includes a binary phase accumulator circuit like the binary phase accumulator circuit 10 of FIG. 1 that is coupled to the system clock signal on line 18 to generate the n-bit phase value output on lines 14 and the Edge signal on line 40. As previously mentioned, the Edge signal on line 40 may be used to generate a synthesized target output frequency clock signal by delaying it by the fractional portion F of the frequency divisor that is registered in the flip-flops 36 on the clock pulse from the system clock signal input that occurs following the assertion of the CARRY signal on line 34 of FIG. 1. As will be appreciated by persons of ordinary skill in the art, the synthesized target output frequency clock signal generated by a fractional frequency divider circuit will be non-synchronous to the system clock signal.

In some embodiments of the invention, the phase and marker signal generator 52 includes both an n-bit phase value output on lines 14 that is coupled to an input of an n-bit variable phase delay circuit 56 and a marker signal output on line 54 that is coupled to an input of variable marker delay circuit 64. The marker signal on line 54 is generated periodically every N cycles of the system clock signal on line 18 and is asserted in the same cycle of the system clock signal as the generation of the Edge signal on line 40. The marker signal on line 54 can be used for various purposes, one example being to signal a system of the occurrence of a particular Edge signal for the purpose of changing the divisor used in a frequency synthesizer included in the system. The marker signal on line 54 can be implemented by any of a number of different circuits. In the example shown in FIG. 2, phase and marker signal generator 52 generates the marker signal using a clock divider circuit 65 and an AND gate 67. Clock divider circuit 65 is coupled to system clock 20 for receiving system clock signal 18, and includes an output coupled to AND gate 67. AND gate 67 is coupled to binary phase accumulator circuit 10 for receiving the edge signal on line 40. Clock divider circuit 65 is operable to divide the system clock signal 18 by N. At AND gate 67 the Edge signal on line 40 gates the output of the clock divider circuit 65.

The n-bit variable phase delay circuit 56 functions to delay the n-bit phase value output on lines 14 by a variable amount. The delayed n-bit phase value at the output of the n-bit variable phase delay circuit 56 is shown as being coupled in series with an n-bit fixed phase delay circuit 58 having an output coupled to the data input (D) of n-bit phase value flip-flop 60. N-bit fixed phase delay circuit 58 is not an actual discrete circuit element in the design but represents the inherent delay through the n-bit phase value signal path from the phase and marker signal generator 52 to the data input of the n-bit phase flip-flop 60. The amount of delay provided by the fixed phase delay circuit 58 represents the distributed delay paths inherent in the design. The data outputs (Q) of the n-bit phase flip-flop 60 form the n-bit Phase Out output signal on lines 62.

The marker signal on line 54 is provided to the variable marker delay circuit 64 that functions to delay the marker signal. The delayed marker signal at the output of the variable marker delay circuit 64 is shown as being coupled to a fixed marker delay circuit 66 having an output coupled to the data input (D) of marker flip-flop 68. The fixed marker delay circuit 66 is not an actual discrete circuit element in the design but represents the inherent delay through the marker signal path from the phase and marker signal generator 52 to the data input of the marker flip-flop 68. The amount of delay provided by the fixed marker delay circuit 66 represents the distributed delay paths inherent in the design. The data output (Q) of the marker flip-flop 68 forms the Marker Out signal on line 70, which is thus a latched delayed marker output.

The amount of variable delay provided by variable marker delay circuit 64 is set to be the same amount as the variable delay provided by n-bit variable phase delay circuit 56. In some embodiments where the delay exhibited by fixed marker delay circuit 66 is significantly different from the delay exhibited by fixed phase delay circuit 58, the values presented by the respective variable marker delay circuit 64 and n-bit variable phase delay circuit 56 are preferably set to different amounts so as to compensate. In one particular embodiment, different phase delay offset AO signals, to be described further below, may be provided for each of the phase delay and marker delay paths. The n-bit variable phase delay circuit 56 and marker delay circuit 64 and the fixed phase delay circuit 58 and marker delay circuit 66 can be formed as analog delay circuits or as shift register delay circuits as is known in the art.

While the fixed phase delay circuit 58 and fixed marker delay circuit 66 are shown in FIG. 2 following the n-bit variable phase delay circuit 56 and marker delay circuit 64, persons of ordinary skill in the art will appreciate that the fixed delay circuits 58 and 66 represent distributed delay inherent in their respective circuit paths and thus are not particularly before, or following, the n-bit variable phase delay circuit 56 and marker delay circuit 64, respectively.

The amount of delay provided by the n-bit variable phase delay circuit 56 and the variable marker delay circuit 64 is determined as a function of the n-bit phase value output on lines 14. The n-bit phase value output on lines 14 is coupled to one set of inputs of a multibit delay adder 72. The other set of inputs of the multibit delay adder 72 is provided by an n-bit phase delay offset AO signal that is coupled to the multibit delay adder on lines 74. The n-bit output of the multibit delay adder 72 on lines 76 is a control signal that is coupled to a control input of both n-bit variable phase delay circuit 56 and variable marker delay circuit 64 and is used to set the delay time of each of n-bit variable phase delay circuit 56 and variable marker delay circuit 64. The phase delay offset AO signal on lines 74 is a fixed delay value selected to ensure a valid setup and hold time for the delayed n-bit phase value output coupled to the D inputs of the n-bit phase flip-flop 60 and the delayed marker signal at the D input of the marker flip-flop 68. The value of the phase delay offset AO signal on lines 74 is added to the n-bit phase value output on lines 14 in the multibit delay adder 72 and the resulting sum is the control signal that controls the delay of the variable phase delay circuit 56 and marker delay circuit 64. AO sets a minimum delay value when the n-bit phase value output on lines 14 is zero, i.e. at a minimum possible value, to assure that the delay through the circuit 50 from an edge of the system clock signal on line 18 to clock the phase flip-flop 60 and marker flip-flop 68, as will be described below, is longer than the total combined delay of the n-bit phase value through the n-bit variable phase delay circuit 56 and the fixed phase delay circuit 58 to the n-bit phase flip-flops 60 and longer than the total combined delay of the marker signal through the variable marker delay circuit 64 and the fixed marker delay circuit 66 to the marker flip-flop 68 when the n-bit phase value output on lines 14 is zero. The value of the phase delay offset AO signal on lines 74 is determined at circuit design time by considering the fixed delays in the binary phase accumulator circuit 10 and the marker and n-bit phase value output paths in circuit 10 plus some margin for setup/hold. The value of the phase delay offset AO signal on lines 74 is thus determined by characterizing the design in which the circuit 50 is used. The value of AO is held in a register and is initially set using circuit simulations and is trimmed as may be necessary when actual silicon is received and characterized.

The system clock signal on line 18 provided by system clock source 20 is coupled to a first input of a latching clock delay circuit 78. The Edge signal on line 40 identifies a system clock edge at which the n-bit phase value and Marker signals are valid and is coupled to a second input of the latching clock delay circuit 78. The latching clock delay circuit 78 functions to delay the Edge signal on line 40 to provide a latching clock signal in a second clock domain non-synchronous with the first clock domain for transferring the n-bit phase value (and optionally the marker signal). The Edge signal on line 40 is coupled to one input of an AND gate 80 of the latching clock delay circuit 78, and the system clock signal on line 18 is coupled to a second input of the AND gate 80. AND gate 80 uses the Edge signal to gate the system clock signal on line 18. The output of the AND gate 80 is coupled to the input of a variable latching clock delay circuit 82 of the latching clock delay circuit 78 that functions to delay the output of the AND gate 80 and whose delay value is set as a function of the n-bit phase value output on lines 14 to which its delay control input is coupled.

The output of the variable latching clock delay circuit 82 is shown as being coupled to a fixed latching clock delay circuit 84 having an output coupled to the clock inputs of the n-bit phase value flip flop 60 and the marker flip-flop 68. The fixed latching clock delay circuit 84 is not an actual discrete circuit element in the design but represents the inherent delay through the latching clock delay signal path from the Edge output of the phase and marker signal generator 52 to the clock inputs of the n-bit phase value flip flop 60 and the marker flip-flop 68. The amount of delay provided by the fixed latching clock delay circuit 84 represents the distributed delay paths inherent in the design. The variable latching clock delay circuit 82 is set to provide a latching clock delay that is longer than each of the variable phase delay circuit 56 and the variable marker delay circuit 64 and to have a delay long enough to assure that the delayed n-bit phase value signal output by fixed phase delay circuit 58 and the delayed marker signal output by fixed marker delay circuit 66 both meet the setup times required by the n-bit phase flip flop 60 and the marker flip flop 68 when the n-bit phase value is zero. The delay of the variable latching clock delay circuit 82 is selected as a function of the characteristics of the particular design. The reason for providing the variable latching clock delay circuit 82 in addition to the n-bit variable phase delay circuit 56 is that delays need to be provided in both the clock and data paths to the n-bit phase flip flop 60 and the marker flip-flop 68 is to assure that the n-bit phase value being set up and held for latching is the correct one. This is necessary because, depending on the period of the latching clock output signal 86, the fixed circuit delays inherent in the circuit 50 represented by reference numerals 58, 66, and 84 can be longer than the period of the latching clock output signal 86. In such instances, failure to delay signal on both the data paths and the clock paths to the n-bit phase flip flop 60 and the marker flip-flop 68 will lead to the wrong n-bit phase value being latched. Delaying the data path signals as well as the clock path signal to the n-bit phase flip flop 60 and the marker flip-flop 68 assures that the correct n-bit phase data is being latched in the n-bit phase flip flop 60 and that the Marker signal has not ended prior to the latching clock output signal 86 arriving at the clock input to the marker flip-flop 68.

The output of the fixed latching clock delay circuit 84 is the output of the latching clock delay circuit 78 and forms the latching clock output signal and is coupled to the clock inputs of the n-bit phase flip-flops 60 and the marker flip-flop 68. The latching clock output signal on line 86 is in the second clock domain and is generated in response to the edge of the system clock signal on line 18 gated by the Edge signal and the corresponding delay provided by the variable output latching clock delay circuit 82 and the fixed output latching clock delay circuit 84. The latching clock output signal on line 86 is non-synchronous to the system clock signal on line 18.

Figure 3:
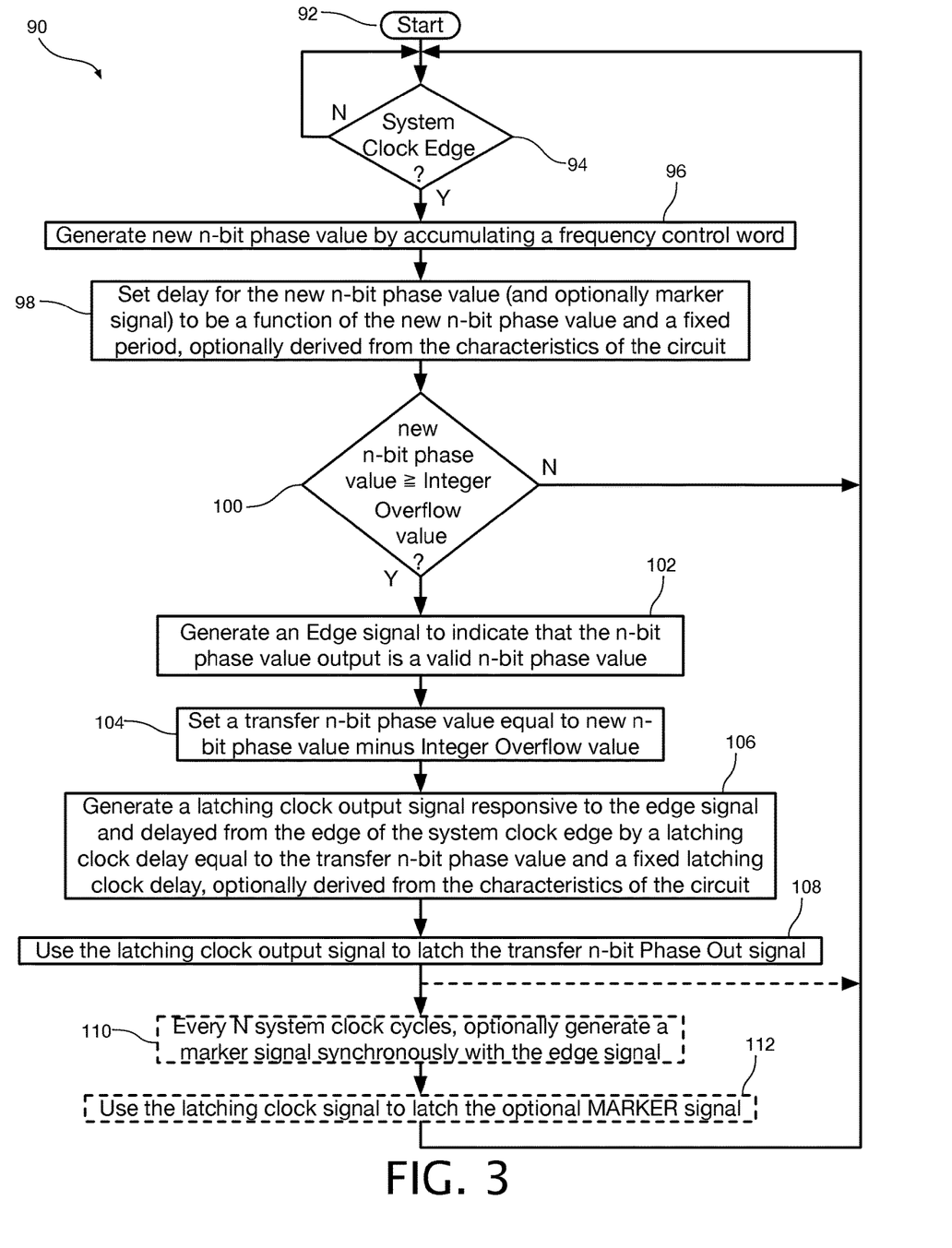
FIG. 3 is a flow diagram shows an illustrative method for transferring a phase value between circuits clocked by non-synchronous clock signals in accordance with an aspect of the invention.

Referring now to FIG. 3, a flow diagram shows an illustrative method 90 for transferring a data value between circuits clocked by non-synchronous clock signals in accordance with an aspect of the invention. The method starts at reference numeral 92.

At reference numeral 94, the system waits in a loop for a system clock signal edge. At the edge of the system clock signal as indicated by the decision at reference numeral 94, a new n-bit phase value is generated by accumulating a frequency control word at reference numeral 96. At reference numeral 98, a delay for the new n-bit phase value (and optionally marker signal) is set to be a function of the value of the new n-bit phase value and a fixed period, optionally derived from the characteristics of the circuit.

At reference numeral 100, it is determined whether the new n-bit phase value is equal to, or greater than, an integer overflow value. If not, the method returns to reference numeral 94, where the system waits in a loop for another system clock edge.

If at reference numeral 100 it is determined that the new n-bit phase value is equal to, or greater than, the integer overflow value (reference numeral 26 of FIG. 1), the method proceeds to reference numeral 102, where an Edge signal is generated. The Edge signal is generated to indicate that the n-bit phase value output is a valid n-bit phase value. The method then proceeds to reference numeral 104, where a transfer n-bit phase value is set to be equal to the value of the new n-bit phase value minus the integer overflow value.

At reference numeral 106 a latching clock output signal is generated, responsive to the Edge signal, and delayed from the edge of the system clock by a latching clock delay (e.g. by the output clock delay circuit 78), whose delay is equal to the transfer n-bit phase value and a fixed latching clock delay (e.g. by a serial combination of the variable output latching clock delay circuit 82 and the fixed output latching clock delay circuit 84 of FIG. 2), whose fixed latching clock delay is optionally derived from the characteristics of the circuit. The combination of the variable output latching clock delay circuit 82 and the fixed output latching clock delay circuit 84 is non-synchronous to the system clock edge. At reference numeral 108, the latching clock output signal is used to latch the transfer n-bit phase value as the n-bit Phase Out output signal. At reference numeral 110, a marker signal may optionally be generated every N system clock cycles synchronously with the Edge signal. In this optional situation, the system counts system clock cycles and generates the marker signal each time N system clock cycles have occurred synchronously with the generated Edge signal of reference numeral 102. At optional reference numeral 112, the latching clock signal that has been delayed by the non-synchronous clock delays is used to latch the optional marker signal if it has been generated. The method then returns to reference numeral 94 to wait for another system clock edge. Persons of ordinary skill in the art will appreciate that the method returns to reference numeral 94 following reference numeral 108 in embodiments of the invention that do not provide for generation of the marker signal as shown by the dashed arrow.

The present invention requires less circuitry than would be required by a solution that re-creates the phase information, by for example, replicating the binary phase accumulator circuit 10 in the output clock domain. Such a solution would also require additional synchronization circuitry. The present invention saves power and area/cost compared to such an alternative solution.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit for transferring a n-bit phase value between circuits clocked by non-synchronous clock signals, the circuit comprising:
an input for a system clock signal;
a phase and marker signal generator coupled to the input for the system clock signal, the phase and marker signal generator including a binary phase accumulator circuit configured to generate an n-bit phase value output, and an edge signal configured to indicate that the n-bit phase value output is a valid n-bit phase value output;
a latching clock delay circuit having a first input coupled to the input system clock signal, a second input coupled to receive the edge signal of the phase and marker signal generator, and an output;
an n-bit variable phase delay circuit having an input, a control input, and an output, the input coupled to the n-bit phase value output of the phase and marker signal generator;
a multibit delay adder having a first input coupled to the n-bit phase value output of the phase and marker signal generator, a second input coupled to an n-bit phase delay offset signal, and an output coupled to the control input of the n-bit variable phase delay circuit; and
an n-bit phase flip-flop having data inputs coupled to the output of the n-bit variable phase delay circuit, a clock input coupled to the output of the latching clock delay circuit and a Phase Out output.

2. The circuit of claim 1 wherein the latching clock delay circuit comprises:
a gate having a first input coupled to the input system clock signal, a second input coupled to receive the edge signal of the phase and marker signal generator, and an output; and
a variable latching clock delay circuit having an input coupled to the output of the gate and an output.

3. The circuit of claim 2 wherein:
the gate is an AND gate; and
the variable latching clock delay circuit includes a control input coupled to the n bit phase value output of the phase and marker signal generator.

4. The circuit of claim 1 wherein the binary phase accumulator circuit in the phase and marker signal generator is configured to:
accumulate a frequency control word value (FCW) at every system clock signal edge;
output the accumulated FCW value as the n-bit phase value output after each system clock signal edge;
when the accumulated FCW value reaches an integer overflow value, modify the generated n-bit phase value output at the subsequent system clock signal edge to be equal the integer overflow value minus an immediately previous value of the n-bit phase value output; and
output the edge signal at the subsequent system clock signal edge.

5. The circuit of claim 1 further comprising:
a marker output of the phase and marker signal generator;
a variable marker delay circuit having an input, a control input, and an output, the input coupled to the marker output of the phase and marker signal generator, the control input of the variable marker delay circuit coupled to the output of the multibit delay adder; and
a marker flip-flop having a data input coupled to the output of the variable marker delay circuit, a clock input coupled to the latching clock delay circuit and a latched Marker Out output.

6. The circuit of claim 5 wherein the phase and marker signal generator is configured to generate a marker signal at the marker output every N system clock signal cycles in the same system clock signal cycle as the edge signal of the phase and marker signal generator.

7. A method for transferring a transfer n-bit phase value between circuits clocked by an edge of a system clock signal and by circuits clocked by an edge of a latching clock output signal, where the latching clock output signal is non-synchronous with the system clock signal, the method comprising:
generating a new n-bit phase value by accumulating a frequency control word in response to an edge of the system clock signal;
setting a delay for the new n-bit phase value to be a function of the new n-bit phase value and a fixed period;
when the n-bit phase value equals or exceeds an integer overflow value:
generating an edge signal;
setting a transfer n-bit phase value equal to a value by which the new n-bit phase value exceeded the integer overflow value; and
generating a latching clock output signal responsive to the generated edge signal and delayed from the edge of the system clock signal by a latching clock delay that is a function of the transfer n-bit phase value and a fixed latching clock delay.

8. The method of claim 7, wherein the latching clock delay is the sum of the transfer n-bit phase value and the fixed latching clock delay.

9. The method of claim 7 wherein the fixed latching clock delay is derived from circuit characteristics.

10. The method of claim 7, wherein the fixed period is derived from characteristics of the circuits clocked by the edge of the system clock signal.

11. The method of claim 7 wherein the fixed latching clock delay comprises a delay derived from characteristics of the circuits clocked by the edge of the system clock signal.

12. The method of claim 7 wherein the latching clock delay is set to be greater than the delay for the new n-bit phase value.

13. The method of claim 7 further comprising generating a marker signal every N system clock edges.

14. The method of claim 13 wherein generating a marker signal every N system clock edges comprises generating the marker signal synchronously with the edge signal.

15. The method of claim 13 further comprising latching the marker signal.

16. The method of claim 15 wherein latching the marker signal comprises latching the marker signal using the generated latching clock output signal.

* * * * *